(12) United States Patent
Ragnarsson et al.

(10) Patent No.: US 8,211,812 B2
(45) Date of Patent: Jul. 3, 2012

(54) METHOD FOR FABRICATING A HIGH-K DIELECTRIC LAYER

(75) Inventors: Lars-Ake Ragnarsson, Leuven (BE); Paul Zimmerman, Cedar Creek, TX (US); Kazuhiko Yamamoto, Kadoma (JP); Tom Schram, Rixensart (BE); Wim Deweerd, San Jose, CA (US); David Brunco, Tervuren (BE); Stefan De Gendt, Wijnegem (BE); Wilfried Vandervorst, Mechelen (BE)

(73) Assignee: IMEC, Leuven (BE)

( * ) Notice: Subject to any disclaimer, the term of this patent is extended or adjusted under 35 U.S.C. 154(b) by 273 days.

(21) Appl. No.: 12/104,353

(22) Filed: Apr. 16, 2008

(65) Prior Publication Data

US 2008/0265380 A1 Oct. 30, 2008

Related U.S. Application Data

(63) Continuation of application No. PCT/JP2006/321438, filed on Oct. 20, 2006.

(60) Provisional application No. 60/728,796, filed on Oct. 20, 2005.

(51) Int. Cl.
*H01L 21/31* (2006.01)
*H01L 21/469* (2006.01)
(52) U.S. Cl. ............... 438/785; 257/E21.409
(58) Field of Classification Search ............... 438/785, 438/778; 257/E21.409
See application file for complete search history.

(56) References Cited

U.S. PATENT DOCUMENTS

| 6,294,447 | B1 * | 9/2001 | Boone et al. ............ 438/585 |
| 6,569,240 | B1 * | 5/2003 | Nishikawa et al. ........ 117/99 |
| 6,656,852 | B2 * | 12/2003 | Rotondaro et al. ........ 438/749 |
| 7,071,122 | B2 * | 7/2006 | Saenger et al. ............ 438/778 |
| 7,442,415 | B2 * | 10/2008 | Conley et al. ............ 427/255.36 |
| 2002/0135048 | A1 * | 9/2002 | Ahn et al. ............ 257/632 |
| 2004/0105213 | A1 | 6/2004 | Egger et al. |
| 2004/0129674 | A1 | 7/2004 | Bease et al. |

(Continued)

FOREIGN PATENT DOCUMENTS

EP 1 253 646 A1 10/2002

(Continued)

OTHER PUBLICATIONS

Yang, et al.; Dramatic reduction of gate leakage current in 1.61 nm $HfO_2$ high-k dielectric poly-silicon gate with $Al_2O_3$ capping layer, Electronics Letters, vol. 38, No. 20, Sep. 26, 2002 issue; pp. 1223-1225; XP006018918.

(Continued)

*Primary Examiner* — Stephen W Smoot
*Assistant Examiner* — Vicki B Brooker
(74) *Attorney, Agent, or Firm* — Knobbe Martens Olson & Bear LLP

(57) ABSTRACT

One inventive aspect relates to a method for fabricating a high-k dielectric layer. The method comprises depositing onto a substrate a layer of a high-k dielectric material having a first thickness. The high-k dielectric material has a bulk density value and the first thickness is so that the high-k dielectric layer has a density of at least the bulk density value of the high-k dielectric material minus about 10%. The method further comprises thinning the high-k dielectric layer to a second thickness. Another inventive aspect relates to a semiconductor device comprising a high-k dielectric layer as fabricated by the method.

15 Claims, 10 Drawing Sheets

U.S. PATENT DOCUMENTS

2005/0051119 A1  3/2005  Bloms et al.

FOREIGN PATENT DOCUMENTS

WO    WO 2005/013349 A2    2/2005
WO    WO 2006 039029    4/2006
WO    WO 2007 046546 A1    4/2007

OTHER PUBLICATIONS

Vancervorst, et al.; Physical characterization of ultrathin high k dielectrics; IEEE; Apr. 24, 2003; pp. 40-50; XP008074921.

Wang, et al.; Evaluation of the effectiveness of $H_2$ plasmas in removing boron from Si after etching of $HfO_2$ films in $BCl_3$ plasmas; J. Vac. Sci. Tehcnol. B, vol. 23, No. 2; Mar./Apr. 2005 issue; XP012079852.

Written Opinion of the International Searching Authority regarding International Application No. PCT/JP2006/321438 filed Oct. 20, 2006.

International Search Report regarding International Application No. PCT/JP2006/321438 dated Feb. 20, 2007.

Caymax et al; High-k materials for advanced gate stack dielectrics: a comparison of ALCVD and MOVCD as deposition technologies, Proceedings of the Material Research Society Symposium 2003 vol. 765.

* cited by examiner

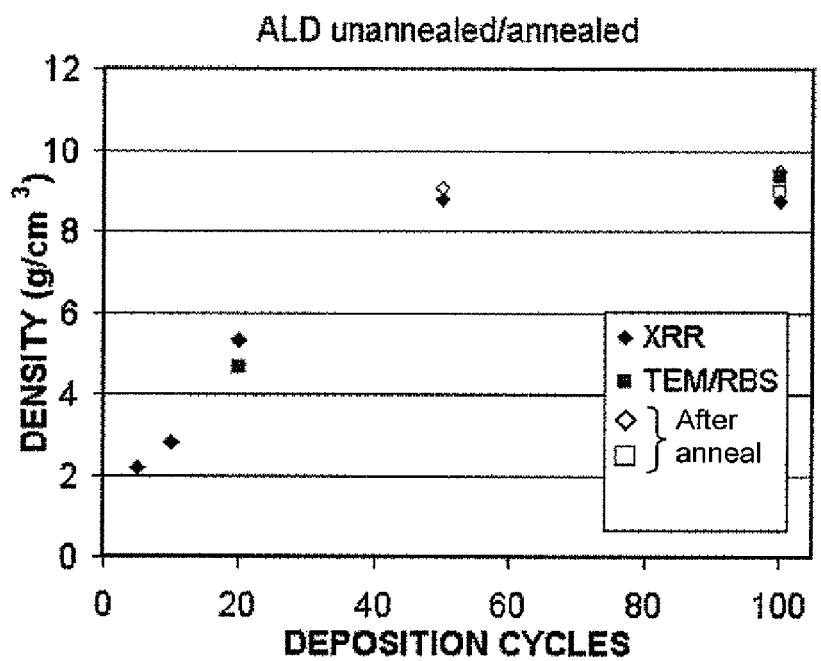
FIG. 1a – PRIOR ART
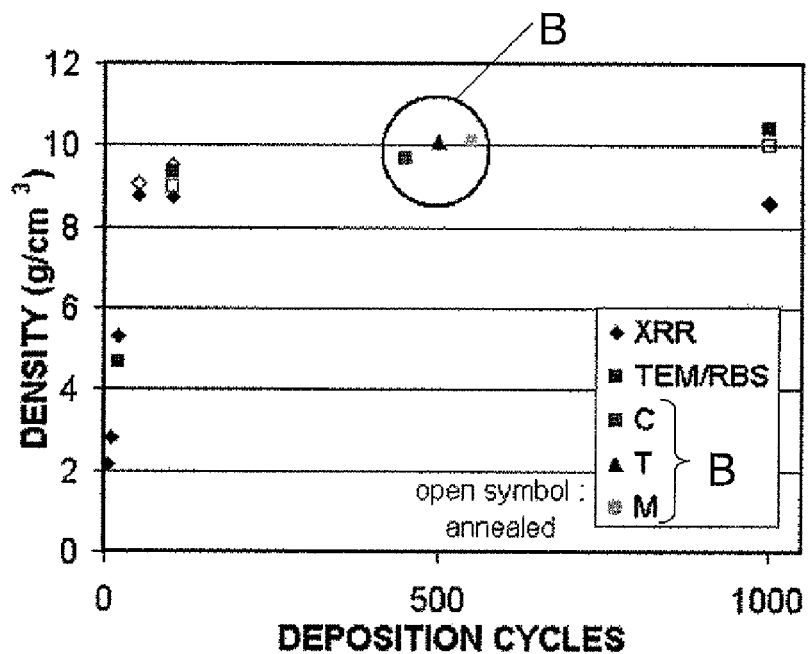
FIG. 1b – PRIOR ART

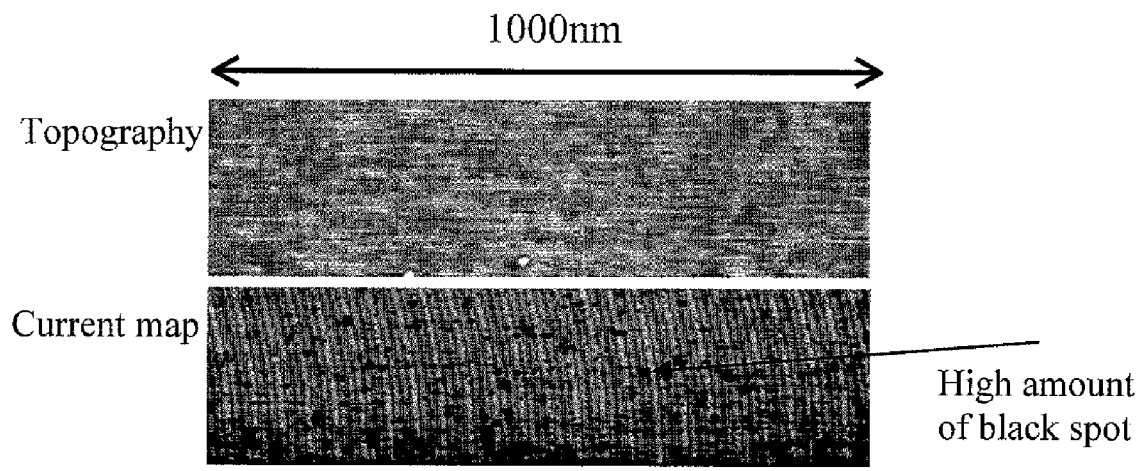
FIG. 2 – PRIOR ART
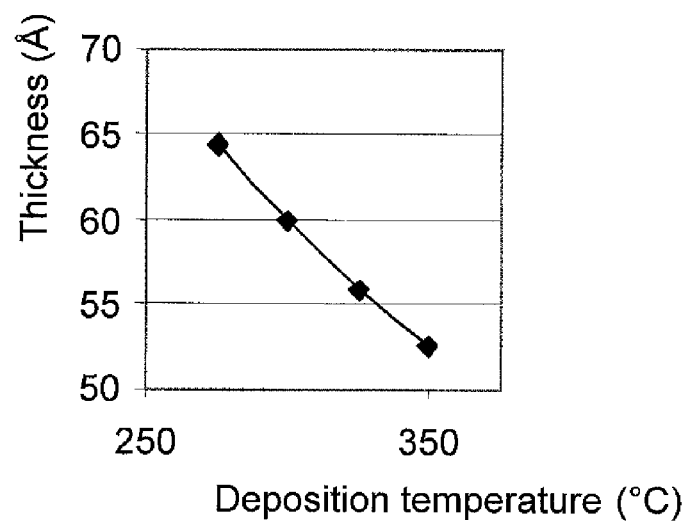
FIG. 3 – PRIOR ART

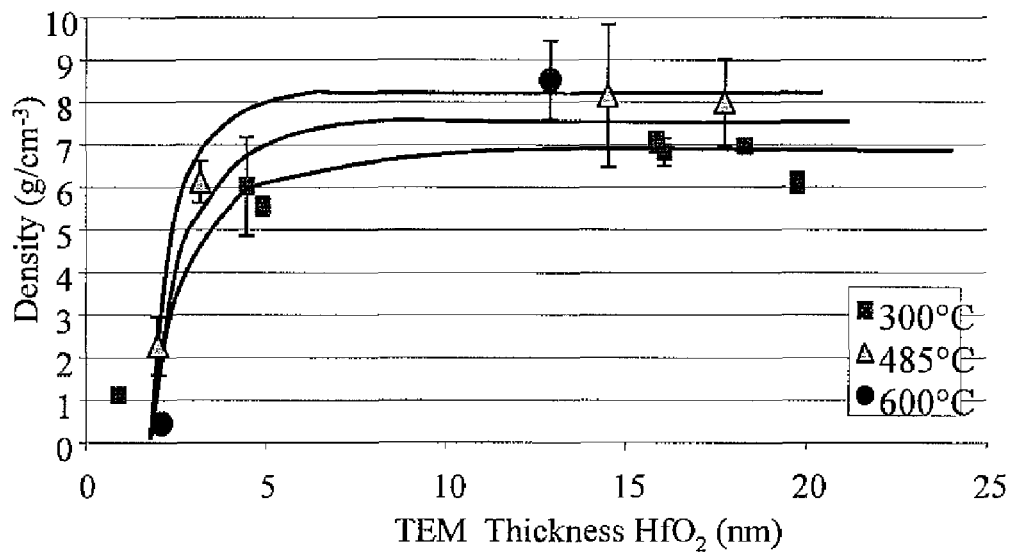
FIG. 4 – PRIOR ART
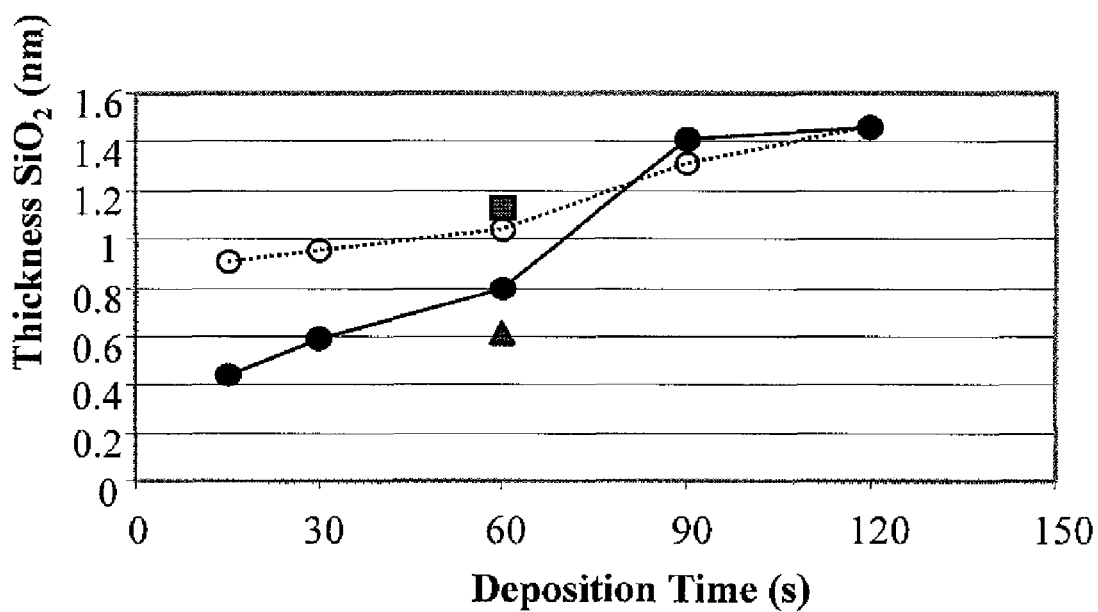
FIG. 5 – PRIOR ART

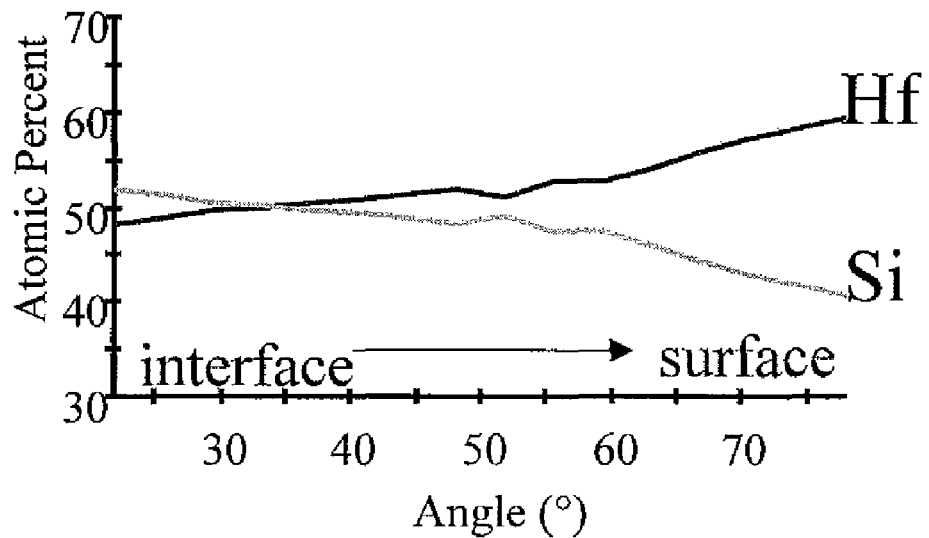
FIG. 6a
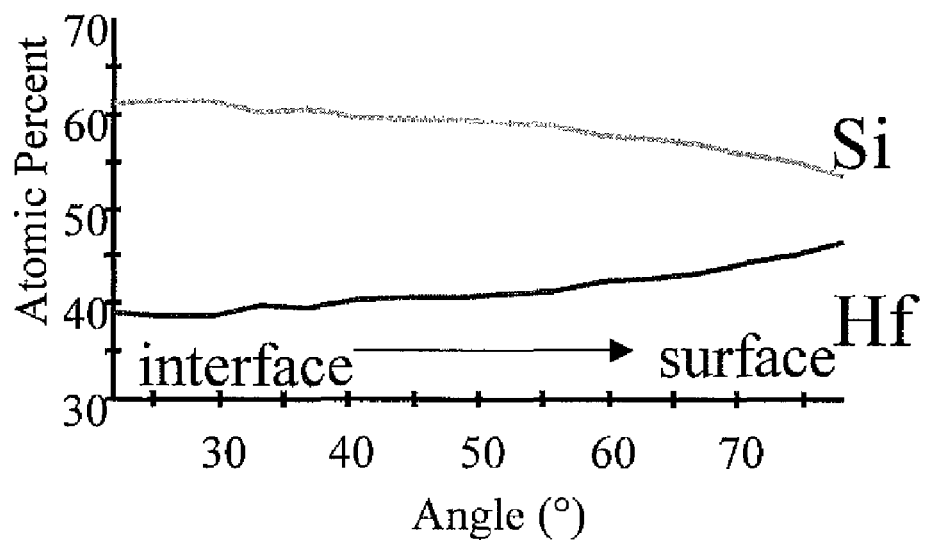
FIG. 6b – PRIOR ART

METHOD FOR FABRICATING A HIGH-K DIELECTRIC LAYER

CROSS REFERENCE TO RELATED APPLICATIONS

This application is a continuation of PCT Application No. PCT/JP2006/321438, filed Oct. 20, 2006, which claims priority under 35 U.S.C. §119(e) to U.S. provisional patent application 60/728,796 filed on Oct. 20, 2005. Each of the above applications is herein incorporated by reference in its entirety.

BACKGROUND OF THE INVENTION

1. Field of the Invention

The present invention relates to methods for forming high-k dielectric layers, in particular to methods for forming high-k dielectric layers used as gate dielectric in field effect transistors, to high-k dielectric layers so obtained, and to semiconductor devices comprising such high-k dielectric layers.

2. Description of the Related Technology

Nowadays, one of the main microelectronics industry's demands is the increase of the circuit density. This means that devices have to be scaled to continuously smaller dimensions. The shrinking of the field effect transistor feature size necessitates the decrease of the gate dielectric layer thickness that reaches its practical limit with the conventional gate dielectric material, like silicon oxide or silicon oxynitride. Because dielectric layer thicknesses of only a few nanometers are expected to be commonly used in the future, alternative materials have to be considered with which it is possible to still have an EOT (equivalent oxide thickness) of a few nanometer but with a larger physical thickness. These materials, characterized by a higher dielectric constant compared to silicon oxide (k=3.9), have been called high-k dielectric materials. Some examples of these materials are hafnium oxide, tantalum oxide and zirconium oxide, which have a k-value in the range of 20-25.

When using a layer of these high-k dielectric materials in e.g. transistor applications two key requirements are very important:
- an extremely high quality of the dielectric-channel interface, and
- the layer is able to withstand semiconductor processing conditions after its formation.

A high-k dielectric layer can be deposited by several techniques, as there are PVD (physical vapor deposition) and CVD (chemical vapor deposition).

When depositing a high-k dielectric layer by CVD, mostly two techniques may be used, namely Atomic Layer Deposition (ALD) and Metal Organic CVD (MOCVD).

ALD is based on subsequent exposure of the substrate surface to precursor gases, for example a metal halide and $H_2O$. In between two precursor pulses, an $N_2$ pulse purges out non-reacted reagents as well as the reaction products. The precursor pulses are long enough in order to saturate the full wafer surface with the precursor molecule in a chemisorption reaction.

The MOCVD reaction is a typical thermally driven system with simultaneous injection of the precursors, typically a metal organic precursor and oxygen.

A major problem is that thin high-k dielectric layers suffer more from electrical leakage than bulk, i.e. thick, high-k dielectric layers.

FIGS. 1a and b show the density ($g/cm^3$) of ALD-deposited $HfO_2$ layer versus number of deposition cycles of the ALD sequence. For reference purposes the values for cubic (C), tetragonal (T) and monoclinic (M) phase of a bulk, i.e. a thick, layer is added in the circle B shown in FIG. 1b. The density of the $HfO_2$ layer was determined using Rutherford Backscattering Spectroscopy (RBS) in combination with Transmission Electron Microscopy (TEM) (squares) or using X-Ray Reflectance (XRR) (diamonds). FIG. 1a shows the density of the ALD-deposited film as a function of the number of deposition cycles during the first 100 deposition cycles. Some of the deposited films were annealed (open symbols), while other deposited films remain as-deposited (solid symbols). FIG. 1b shows the density during the first 1000 deposition cycles. It cannot be seen from the drawings, but a number of 40 cycles corresponds to a layer thickness of about 2 nm, 100 cycles to about 5 nm and 200 cycles to about 10 nm. As shown by the encircled data points B in FIG. 1b, the density value of the bulk phases is about $10 g/cm^3$. This bulk density value can only be reached with ALD-deposited layers after more than about 200 deposition cycles. For fewer cycles, which means thinner layers, the density of the ALD-deposited layer decreases significantly with decreasing number of cycles, resulting in electrically leaky regions in the high-k dielectric layer. When using such thin high-k dielectric layers, although having electrically leaky regions, as gate dielectric in e.g. semiconductor devices, the electrical performance of the device significantly decreases.

FIG. 2 is a Conductive Atomic Force Microscopy (C-AFM) picture from scanning a 2 nm thick MOCVD hafnium silicate ($HfSiO_x$) layer over 1000 nm. The topography map (top of FIG. 2) is indicative of the layer roughness having a root mean square roughness value (RMS) of 0.175 nm. The current map (bottom of FIG. 2) shows a high amount of black spots, an example being indicated by the arrow, which indicate electrically leaky regions in the layer.

In "High-k materials for advanced gate stack dielectrics: a comparison of ALCVD and MOCVD as deposition technologies", published in the Proceedings of the Material Research Society Symposium 2003 Vol. 765, Caymax et al report that the density of thin high-k dielectric layers increases with increasing deposition temperature.

FIG. 3 shows the thickness (A) as a function of the ALD deposition temperature. The thickness was determined using an ellipsometric thickness measurement. FIG. 3 shows that for ALD the $HfO_2$ layer thickness decreases with increasing deposition temperature for an equal number of deposition cycles. As the amount of $HfO_2$ deposited per cycle is very similar at all deposition temperatures, this suggests that consequently the density of the ALD deposited layer increases with increasing deposition temperature.

FIG. 4 shows the density ($g/cm^3$) of an MOCVD deposited $HfO_2$ layer as a function of the layer thickness (nm). The thickness of the layer was determined using TEM. The $HfO_2$ layer was deposited at respectively 300° C. (squares), 485° C. (triangles) and 600° C. (circles). FIG. 4 shows that in case of MOCVD the $HfO_2$ layer density also increases with increasing deposition temperature.

However, increasing deposition temperatures lead to a thicker interfacial dielectric layer, e.g. silicon oxide layer, between the high-k dielectric layer and the substrate surface, e.g. silicon substrate surface. FIG. 5 shows the thickness of a silicon oxide interface layer as a function of the deposition time of an MOCVD-deposited $HfO_2$ layer. The $HfO_2$ layer was formed on a silicon substrate which was either covered with 1 nm of silicon oxide formed by Rapid Thermal Oxidation (RTO) (dotted line) (open symbols) or cleaned by HF-dip (solid line) (closed symbols). The layers were deposited at 300° C. (triangles), 485° C. (solid and open circles for cleaned or not cleaned situation respectively) or at 600° C. (squares). In FIG. 5 is shown that after a deposition time of 60 s the silicon oxide interfacial layer under the MOCVD $HfO_2$ layer becomes significantly thicker with increasing deposition temperatures. A thicker interfacial layer results in a decreased k-value of the overall gate dielectric layer as it is a stack of a silicon-oxide layer with a k-value of about 3.9 and a high-k layer. Using a thus formed high-k dielectric layer as gate dielectric layer in e.g. semiconductor devices leads to a deterioration in the electrical performance of the device.

Further it is also known that a post-deposition anneal of the high-k dielectric layer increases the density. However, during this anneal also the thickness of the interfacial layer between the high-k dielectric layer and the substrate surface increases, again resulting in lower k-values.

Hence, there is a need for a method to form high-quality high-k dielectric layers, preferably thin, i.e. in the nanometer range, which can be used as gate dielectric layer in semiconductor devices, e.g. in field effect transistors.

SUMMARY OF VARIOUS INVENTIVE ASPECTS

Certain inventive aspects relate to a method for fabricating a high-k dielectric layer, to provide layers thus obtained, and to provide devices comprising such high-k dielectric layers.

In a first aspect of the invention, a method is provided for fabricating a high-k dielectric layer, e.g. a thin, nanometer-scale dielectric layer, comprising:
  depositing onto a substrate a high-k material so as to form a high-k dielectric layer with a first thickness, the high-k dielectric material having a bulk density value, the first thickness being so that the high-k dielectric layer has a density of at least the bulk density value of the high-k dielectric material minus about 10%, and
  thinning the high-k dielectric layer to a dielectric layer having a second thickness.

According to embodiments of the invention, the second thickness may at least be about ⅕ of the thickness at which the high-k dielectric layer has a density equal to the bulk density value of the high-k dielectric material minus about 10%.

According to embodiments of the invention, high-k material are characterized by a higher dielectric constant compared to silicon oxide (k=3.9) The high-k material may have a k value of greater than 3.9, e.g. higher than 4 such as in the range 4 to 30.

According to embodiments of the invention, thinning the high-k dielectric layer to the second thickness may be performed by etching back the high-k dielectric layer.

According to embodiments of the invention, etching back the high-k dielectric layer may be performed by a wet etching process.

The second thickness may be selected to have a desired layer quality. The layer quality may be defined by parameters such as but not limited to density, film closure, roughness and electrical leakage.

The high-k dielectric layer may be any of a metal oxide, metal silicate, metal oxynitride, metal silicon oxynitride, or any combination thereof.

According to embodiments of the invention, the process of depositing the high-k dielectric layer with a first thickness and etching the high-k dielectric layer to a second thickness may be repeated sequentially.

In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest.

In a second aspect of the present invention, a layer of a high-k dielectric material is provided with a thickness less than the thickness where the density of the layer equals the bulk density value, preferably with a thickness of less than the thickness where the density of the layer equals the bulk density value minus about 10%, e.g. less than about 8 nm, preferably less than about 6 nm, more preferably less than about 4 nm and most preferably less than about 3 nm. The layer of high-k dielectric material manufactured by methods according to embodiments of the present invention, having increased density and decreased electrical leakage compared to an as-deposited layer of a same high-k dielectric material of equal thickness. The layer of high-k material manufactured by methods according to embodiments of the present invention has a density which is equal to the bulk density value of not less than the bulk density minus about 10%, although the thickness of this layer is less than the thickness at which the density of an as-deposited layer of the high-k material will reach its bulk value.

In a further aspect of the present invention, a semiconductor device is provided comprising a layer of a high-k dielectric material according to embodiments of the present invention.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF DRAWINGS

FIGS. 1a and 1b show the density ($g/cm^3$) of a prior art ALD-deposited $HfO_2$ layer as a function of the number of ALD cycles.

FIG. 2 shows the topography (top) and current (bottom) mapping of a prior art MOCVD-deposited Hafnium silicate layer using conductive AFM.

FIG. 3 shows the thickness (Angstrom) of a prior art ALD deposited $HfO_2$ layer as a function of the deposition temperature (° C.).

FIG. 4 shows the density (g/cm³) of a prior art MOCVD deposited HfO₂ layer as a function of the layer thickness (nm) for three deposition temperatures (° C.).

FIG. 5 shows the thickness (nm) of an interfacial silicon oxide layer as a function of the deposition time (s) of a prior art MOCVD deposited HfO₂ layer for different starting substrates and different deposition temperatures.

FIGS. 6a and 6b show the atomic percent of a hafnium-silicate dielectric layer as a function of position in this layer for (a) a deposited and etched-back layer according to an embodiment of the present invention and (b) for an as-deposited layer as known from the prior art.

DETAILED DESCRIPTION OF CERTAIN INVENTIVE EMBODIMENTS

Figure 7:
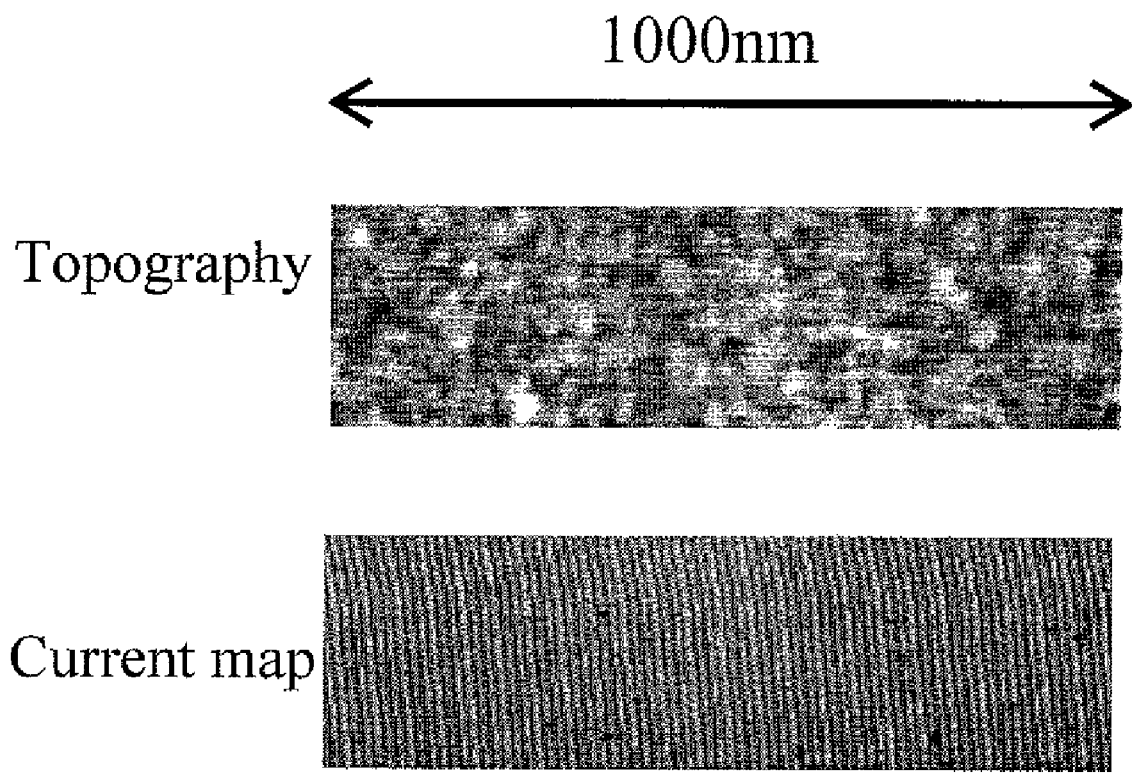
FIG. 7 shows the topography (top) and current (bottom) mapping of a MOCVD-deposited and etched-back Hafnium silicate layer according to an embodiment of the present invention, obtained by using conductive AFM.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In this description a method is disclosed for fabricating a thin high-k dielectric layer comprising:
  providing a substrate, e.g. a semiconductor substrate,
  depositing onto the substrate a high-k material so as to form a dielectric layer with a first thickness, the high-k material having a bulk density value, the first thickness being so that the high-k dielectric layer has a density of at least the bulk density value of the high-k dielectric material minus about 10%, and
  thinning the high-k dielectric layer to a second thickness.

The first thickness may be material dependent, i.e. for some materials the bulk density value minus about 10% may be reached earlier than for other materials.

According to embodiments of the invention, the second thickness may at least be about ⅕ of the thickness at which the high-k dielectric layer has a density equal to the bulk density value of the high-k dielectric material minus 10%. The second thickness preferably is lower than the thickness at which the high-k dielectric layer obtains a density of at least the bulk density value of the high-k dielectric material minus 10%.

It has been found by the present inventors that one of the main reasons why thin as-deposited high-k dielectric layers, whether or not annealed, suffer more from electrical leakage than bulk, i.e. thick, high-k dielectric layers, is that the density of thin high-k dielectric layers is much lower than the density of bulk high-k dielectric layers. Therefore, in accordance with certain embodiments, when manufacturing a high-k dielectric layer, it should have such a thickness that it does not substantially comprise defects or holes. The presence of such defects or holes could lead to leakage when the high-k dielectric layer is used in semiconductor devices. Therefore, according to a method according to embodiments of the present invention, first a layer of high-k dielectric material with a first thickness is deposited. The first thickness is such that a high-k dielectric layer is obtained having a density equal to at least a bulk density value of the high-k material used minus about 10%. The bulk density value of a material is defined as the ratio of the weight of the material to its over-all volume, and is well-defined for every material. The bottom margin of the first thickness thus depends on the high-k material used. When the layer of high-k dielectric material has a density equal to the bulk density value of the high-k material used minus 10%, it can be assumed that there are no or substantially no holes or defects present in the high-k dielectric layer. By then, in accordance with certain embodiments, thinning the high-k dielectric layer to a second thickness which is lower than the first thickness, preferably lower than the thickness at which the bulk density value is obtained, a 'thin' layer of high-k dielectric material is obtained which has a high density and thus comprises no or substantially no holes or defects in it. The second thickness may at least be about ⅕ of the thickness at which the high-k dielectric layer has a density equal to the bulk density value of the high-k dielectric material minus about 10%. An upper margin for the second thickness may be the thickness at which the bulk density value is obtained, or the thickness at which the bulk density value is obtained minus about 10%. Preferably, the second thickness may be between about ⅕ and ½ of the thickness at which the high-k dielectric layer has a density equal to the bulk density value of the high-k dielectric material, with a margin of 10% on the bulk density value, more preferably the second thickness may be between about ⅕ and ⅓ of the thickness at which the high-k dielectric layer has a density equal to the bulk density value of the high-k dielectric material, with a margin of 10% on the bulk density value, and most preferably the second thickness may be between about ⅕ and ¼ of the thickness at which the high-k dielectric layer has a density equal to the bulk density value of the high-k dielectric material, with a margin of 10% on the bulk density value.

Preferably, thinning the high-k dielectric layer to the second thickness may be performed by etching back the deposited high-k dielectric layer, for example by a wet etching process.

In one embodiment, the high-k dielectric material to form the high-k dielectric layer can be selected from the group comprising, e.g., metal oxides such as but not limited titanium oxide, tantalum oxide, aluminium oxide, zirconium oxide, lanthanum oxide, hafnium oxide, hafnium aluminum oxide and hafnium scandium oxide; metal silicates such as but not limited to hafnium silicate and zirconium silicate; metal oxynitrides such as but not limited to titanium oxynitride, tantalum oxynitride, aluminium oxynitride, zirconium oxynitride, lanthanum oxynitride, hafnium oxynitride and hafnium scandium oxynitride; metal silicon oxynitrides such as but not limited to hafnium silicon oxynitride and zirconium silicon oxynitride; or any combination thereof.

Hereinafter, by way of an example, some examples of values for the first and second thickness will be given. It has to be understood that this is not intended to limit the embodiments in any way. Suitable thicknesses are material-dependent. For example, the first thickness can be less than about 15 µm, than about 10 nm, than about 8 nm, or than about 6 nm. The first thickness can be at least about 2 nm in case of ALD deposition. The second thickness can be less than about 6 nm, than about 4 nm, than about 2 nm.

The method can further comprise the process of selecting the first thickness to have a desired layer quality. The layer quality is defined by parameters such as but not limited to film density, film closure, film roughness and particularly film electrical leakage.

The process of depositing the high-k dielectric layer with a first thickness and thinning, e.g. etching back, the high-k dielectric layer to a second thickness can be repeated sequentially. This may be useful for obtaining a high-k dielectric layer with a final thickness below about 2 nm and an increased film closure.

This description further discloses a high-k dielectric material with a thickness of less than about 8 nm, less than about 6 nm, less than about 4 nm or less than about 3 nm having increased density and decreased electrical leakage compared to an as-deposited layer of a same thickness. This high-k dielectric material can be used in a semiconductor device, more particularly in MOSFETS or memory devices.

Memory devices using high-k layers as dielectric layers are known in the art. Examples of such memory devices are, for example, dynamic random access memory devices (DRAM) as disclosed, for example, in United States patent application US 2005/0051119. A DRAM cell typically comprises a transistor connected to a capacitor on which charge can be stored. The capacitor dielectric can be a high-k dielectric.

Another example of such memory device is a non-volatile memory (NVM) device. In such NVM devices charge is stored in a storage gate embedded in the gate stack of a field effect transistor. European patent application EP 01204106 discloses a memory device comprising a dielectric stack comprising dielectric layers with different thickness and dielectric constant (k) value in between the charge storage gate and charge supply region, such as the channel of the memory device, to form an engineered tunnel barrier in between. This engineered dielectric barrier offers a high tunnel barrier in the off-state but only requires a low on-voltage to reduce this tunnel barrier when writing and/or erasing the storage gate.

EXAMPLE

A $HfSiO_x$ layer of 8 nm and a $HfSiO_x$ layer of 2 nm are deposited by MOCVD on different silicon wafers pretreated with a cleaning process sequence ending with wet silicon oxide growth on the silicon substrate. The $HfSiO_x$ contains 55% Hf according to X-ray Photon electron Spectroscopy (XPS) measurement.

Afterwards several 8 nm $HfSiO_x$ layers are etched back to about 2 nm and to about 0.6 nm by means of a dilute hydrogen fluoride solution.

Preferably the etching may be performed at room temperature.

Several characterization techniques may be used to evaluate the different $HfSiO_x$ layers.

The composition of a 2 nm etched back $HfSiO_x$ layer according to an embodiment of the present invention and a 2 nm as-deposited layer is investigated by Angle-resolved X-ray Photoelectron Spectroscopy (AR-XPS). In AR-XPS measurements are performed as a function of measurement angle. When the angle is equal to zero, the bundle of X-rays is incident in a direction perpendicular to the plane of the substrate and deep measurements and thus measurements at the interface between the substrate and the high-k dielectric layer are performed. When the angle is different from zero, e.g.

equal to 80°, the bundle of X-rays is incident in a direction making an angle, e.g. of 80°, with the direction substantially perpendicular to the plane of the substrate and measurements more at the surface are performed.

FIG. 6a shows the atomic percent of the Hafnium (Hf) and silicon (Si) in the deposited and etched-back hafnium silicate layer according to an embodiment of the present invention as a function of the measurement angle, i.e. when going from the interface between the high-k dielectric layer and the semiconductor substrate to the surface of the high-k dielectric. It should be noted that the total thickness of the dielectric layer on the silicon substrate is 9 nm, i.e. 1 nm $SiO_2$ (interfacial oxide layer, resulting from the cleaning procedure performed) and 8 nm deposited $HfSiO_x$. The layer was etched from the total thickness of 9 nm as-deposited to about 3 nm (1 nm $SiO_2$ and 2 nm $HfSiO_x$). FIG. 6b shows the atomic percent of the Hafnium (Hf) and silicon (Si) in an as-deposited hafnium silicate layer as function of the measurement angle, i.e. when going from the interface between the high-k dielectric layer and the semiconductor substrate to the surface of the high-k dielectric. The as-deposited layer on the semiconductor substrate had a thickness of about 3 nm. In FIGS. 6a and 6b can be seen that for both the etched back (FIG. 6a) and the as-deposited layer (FIG. 6b) the layer surface contains more Hf than the bulk of the layer. The bulk of the etched back layer has an Hf; Si ratio of 50:50, whereas the bulk of the as-deposited layer has an Hf:Si ratio of 40:60. This means that the etched back layer is more homogeneous compared to the as-deposited layer, which may have a larger $SiO_2$ like interface between the high-k dielectric layer and the semiconductor substrate. As mentioned before, a larger interface layer reduces the electrical performance of the gate dielectric when used in, for example, a semiconductor device.

Another used characterization technique is Atomic Force Microscopy (AFM). The surface roughness of the 8 nm $HfSiO_x$ layer is measured. Then the sample is etched back in different chemistries, followed by a second surface roughness measurement. The etching was done at room temperature (RT).

TABLE 1 surface roughness measurement on etched back $HfSiO_x$.

| Etch solution in beaker set-up | Ellipsometric thickness (nm) | RMS | Ra |
|---|---|---|---|
| No etch | 8.69 | 0.614 | 0.484 |
| 20s 0.05% HF at RT | 3.07 | 0.490 | 0.375 |
| 270s 0.05% HF at RT | 2.94 | 0.503 | 0.384 |
| 60s 0.03M HF/10% HCl at RT | 3.10 | 0.509 | 0.386 |

The results of the Root Mean Square (RMS) roughness and the Arithmetic Roughness (Ra) are represented in table 1. It appears that after etching the surface roughness is decreased independently of the applied etch chemistry. This implies the possibility of better etch rate control with roughness reduction by choosing an appropriate chemistry.

C-AFM measurements are performed to investigate the topography in combination with the electrical properties of the $HfSiO_x$ layer.

FIG. 7 shows a C-AFM topography and current map at 5V bias voltage of a 8 nm layer of $HfSiO_x$ layer (or an dielectric layer with total thickness of 9 nm) etched back to a $HfSiO_x$ layer of 2 nm (or an dielectric layer with total thickness of 3 nm) scanned over 1000 nm. Compared to a 2 nm as-deposited $HfSiO_x$ layer measured at 4V bias voltage as shown in FIG. 2, the topography map shows that the surface roughness is higher, but the current map shows that the weak spot density is much lower, even at higher bias voltage, which means the etched back layer suffers much less from electrical leakage. The topography map of FIG. 7 shows a rougher surface having a RMS value of 0.244 nm. Compared to the current map of FIG. 2 the layer, which is etched back to about 2 nm after deposition to more than 2 nm, shows less dark spots, indicative of a current flow through the dielectric layer. It should, however, be noted that FIG. 2 shows the roughness for a 2 nm thick as-deposited layer and FIG. 7 shows the roughness for a 9 nm (1 nm $SiO_2$ and 8 nm $HfSiO_x$) as-deposited layer etched back to a layer of 3 nm (1 nm $SiO_2$ and 2 nm $HfSiO_x$). As the latter has already a higher roughness from the start (as it is a thicker layer), the resulting etched-back layer will also have a higher roughness.

Figure 8A:
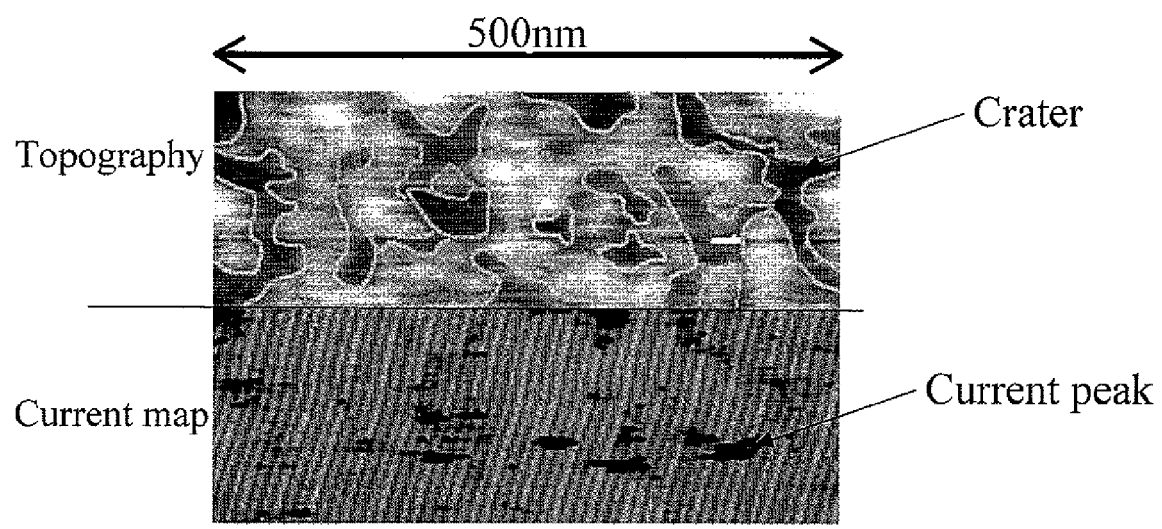
FIGS. 8a and 8b show (a) the topography (top) and current (bottom) surface scan of a MOCVD-deposited and etched-back Hafnium silicate layer according to an embodiment of the present invention, obtained by using conductive AFM and (b) the corresponding topography (top) and current (bottom) line scan.
Figure 8B:
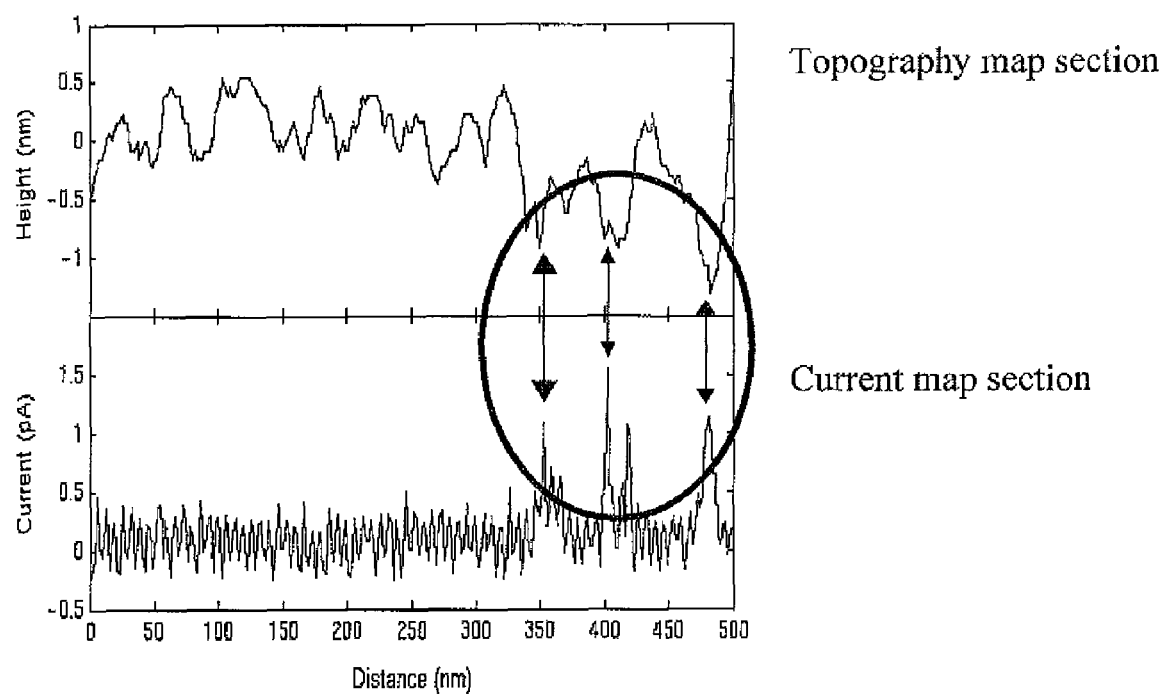

FIGS. 8a and b shows a C-AFM map at 3V bias voltage of a $HfSiO_x$ layer etched back from a thickness at which the layer has a density equal to at least the bulk density value of $HfSiO_x$ minus 10%, in the example given 8 nm, to 0.6 nm and scanned over 500 nm. In FIG. 8a a top view is given of the scanned surface. The black areas on the topography map section (top) correspond to the craters and the black areas on the current map section (bottom) correspond to the current peaks. In FIG. 8b the scan profile for the topography (top) and the current (bottom) is shown. Where the layer is thinnest, i.e. lower level in the topography scan, the largest leakage current is measured as shown by the three arrows. The consistency between the two map sections proofs that locally thinned areas match with leaky regions. Possible causes for local thinning may be non-uniform etching or initial island deposition during the 8 nm layer deposition.

Figure 9:
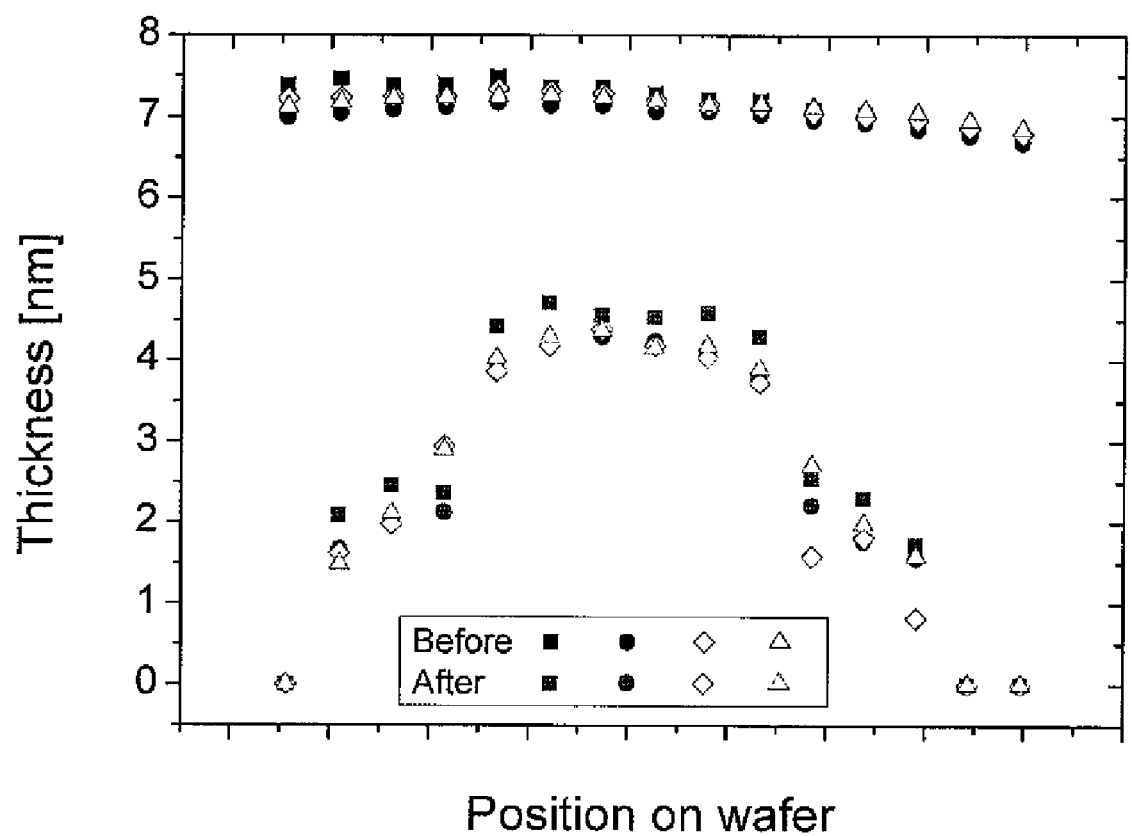
FIG. 9 shows wafer distribution of a HfSiOn layer after deposition and after etch-back according to an embodiment of the present invention.

FIG. 9 shows the distribution over the wafer of an as-deposited HfSiON high-k dielectric layer having a thickness of about 7.5 nm. This layer was etched-back using a slanted wet etch. The time of the etch-back was varied in a radial pattern over the wafer: the regions near the centre of the wafer had the lowest etch time while the regions near the edge of the wafers had the longest etch time. FIG. 9 shows that a controlled etch-back to the desired high-k layer thickness can be achieved by selecting an appropriate etch time. The appropriate etch time can be calculated from the velocity of the outward movement of a nozzle releasing the etch solution. With outward movement is meant the movement of the nozzle from the center of the wafer toward the edges of the wafer.

Figure 10A:
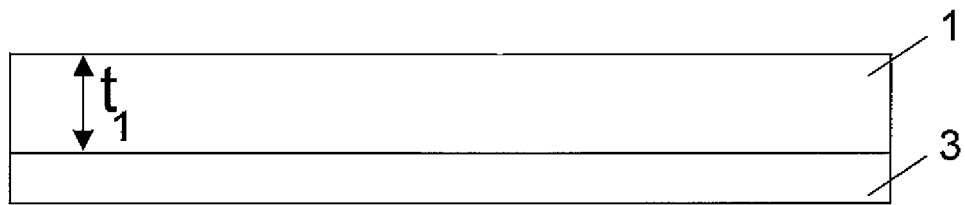
FIGS. 10a-10c illustrate schematic cross-sectional views of a method for manufacturing a field effect transistor according to an embodiment of the present invention.
Figure 10B:
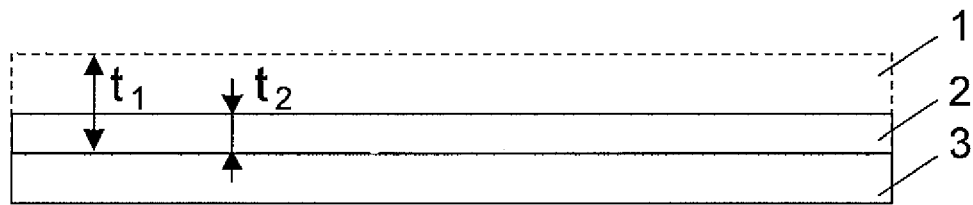
Figure 10C:
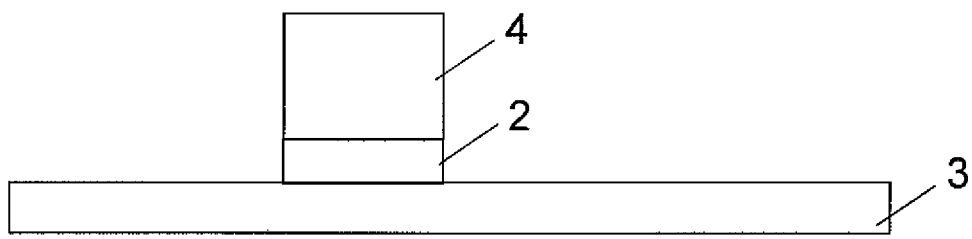

FIGS. 10a-c illustrate schematic cross-sectional views of a method for manufacturing a field effect transistor according to an embodiment of the invention. On a substrate 3, preferably a semiconductor substrate such as silicon, silicon-on-insulator, germanium, germanium-on-insulator, a III-V substrate such as a GaAs, InP, GaAlAs substrate a layer 1 of a high-k dielectric material is deposited. This high-k dielectric layer can be selected from the group comprising metal oxides such as but not limited titanium oxide, tantalum oxide, aluminium oxide, zirconium oxide, lanthanum oxide, hafnium oxide, hafnium aluminum oxide and hafnium scandium oxide; metal silicates such as but not limited to hafnium silicate and zirconium silicate; metal oxynitrides such as but not limited to titanium oxynitride, tantalum oxynitride, aluminium oxynitride, zirconium oxynitride, lanthanum oxynitride, hafnium oxynitride and hafnium scandium oxynitride; metal silicon oxynitrides such as but not limited to hafnium silicon oxynitride and zirconium silicon oxynitride; or any combination thereof. This high-k dielectric can be formed using ALD or MOCVD or any technique known to a person skilled in the art. This high-k dielectric layer 1 has a first selected thickness $t_1$ as shown in FIG. 10a. The first selected thickness $t_1$ is such that the high-k dielectric layer has a density equal to at least the bulk density value of the high-k dielectric material minus 10%. The first selected thickness $t_1$ is dependent on the high-k material used.

After depositing the high-k dielectric layer 1 this layer is thinned down by, for example, using an etching process, preferably a wet etching process, to a second selected thickness $t_2$. The second thickness $t_2$ may at least be ⅕ of the thickness at which the high-k dielectric layer has a density equal to the bulk density value of the high-k dielectric material minus 10%. Preferably, the second selected thickness $t_2$ may be between ⅕ and ½ of the thickness at which the high-k dielectric layer has a density equal to the bulk density value of the high-k dielectric material or between ⅕ and ½ of the thickness at which the high-k dielectric layer has a density equal to the bulk density value of the high-k dielectric material minus 10%, more preferably the second selected thickness $t_2$ may be between ⅕ and ⅓ of the thickness at which the high-k dielectric layer has a density equal to the bulk density value of the high-k dielectric material or between ⅕ and ⅓ of the thickness at which the high-k dielectric layer has a density equal to the bulk density value of the high-k dielectric material minus 10%, and most preferably the second selected thickness $t_2$ may be between ⅕ and ¼ of the thickness at which the high-k dielectric layer has a density equal to the bulk density value of the high-k dielectric material or between ⅕ and ¼ of the thickness at which the high-k dielectric layer has a density equal to the bulk density value of the high-k dielectric material minus 10%. This is illustrated in FIG. 10*b* showing the layer 1 before etching (dotted line) and after etching 2. The wet etchant can comprise HF.

After the desired layer thickness is obtained the processing of the semiconductor device, e.g. field effect transistor, can continue as known to any person skilled in the art. As shown in FIG. 10*c* a gate electrode layer 4 can be formed over the thinned dielectric layer 2. This gate electrode layer 4 can be formed in a semiconductor material such as polycrystalline silicone or in metallic material such as W, Ti, TiN, Ta, TaN, Ru as appreciated by a person skilled in the art. The stack of gate electrode 4 and thinned gate dielectric 2 is then etched to form the gate stack of a semiconductor device, e.g. field effect transistor. Further processing comprises forming source/drain junction regions in the substrate 3 adjacent to the gate stack 2,4 and dielectric sidewall spacers laying adjacent the gate stack 2,4. The exposed semiconductor regions of the source/drain or gate electrode can be silicided.

Figure 11:
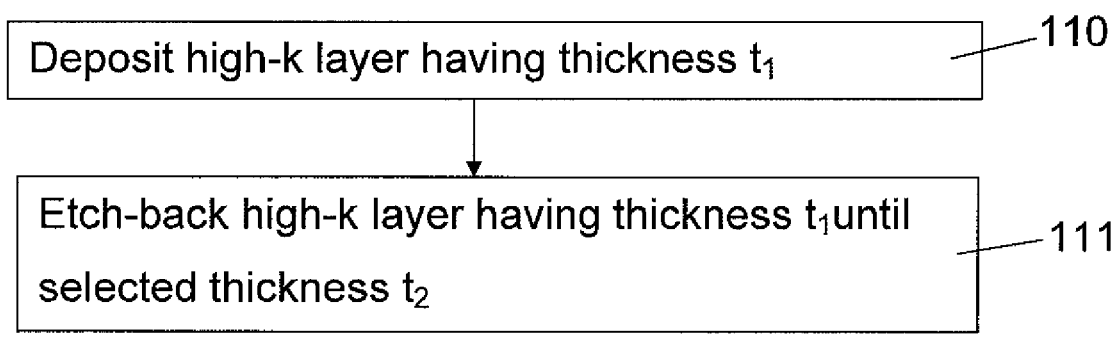
FIG. 11 shows a flow chart illustrating the sequence of a method for manufacturing a thin high-k dielectric layer according to an embodiment of the present invention.

FIG. 11 shows a flow chart illustrating the sequence of a method for manufacturing a thin high-k dielectric layer according to an embodiment of the invention. On a substrate 3, preferably a semiconductor substrate such as silicon, silicon-on-insulator, germanium, germanium-on-insulator, a III-V substrate such as a GaAs, InP, GaAlAs substrate a layer 1 of a high-k dielectric material is deposited as illustrated in process 110. This high-k dielectric layer can be selected from the group comprising metal oxides such as but not limited titanium oxide, tantalum oxide, aluminium oxide, zirconium oxide, lanthanum oxide, hafnium oxide, hafnium aluminum oxide and hafnium scandium oxide; metal silicates such as but not limited to hafnium silicate and zirconium silicate; metal oxynitrides such as but not limited to titanium oxynitride, tantalum oxynitride, aluminium oxynitride, zirconium oxynitride, lanthanum oxynitride, hafnium oxynitride and hafnium scandium oxynitride; metal silicon oxynitrides such as but not limited to hafnium silicon oxynitride and zirconium silicon oxynitride; or any combination thereof. This high-k dielectric can be formed using ALD or MOCVD or any technique known to a person skilled in the art. This high-k dielectric layer 1 has a first selected thickness $t_1$. The first selected thickness $t_1$ is such that the high-k dielectric layer has a density equal to at least the bulk density value of the high-k dielectric material minus 10%. The first selected thickness $t_1$ is dependent on the high-k material used. This high-k dielectric layer 1 is then thinned as illustrated in process 111 to a layer having second selected thickness $t_2$. The second thickness $t_2$ may at least be ⅕ of the thickness at which the high-k dielectric layer has a density equal to the bulk density value of the high-k dielectric material minus 10%. Preferably, the second selected thickness $t_2$ may be between ⅕ and ½ of the thickness at which the high-k dielectric layer has a density equal to the bulk density value of the high-k dielectric material or be between ⅕ and ½ of the thickness at which the high-k dielectric layer has a density equal to the bulk density value of the high-k dielectric material minus 10%, more preferably the second selected thickness $t_2$ may be between ⅕ and ⅓ of the thickness at which the high-k dielectric layer has a density equal to the bulk density value of the high-k dielectric material or between ⅕ and ⅓ of the thickness at which the high-k dielectric layer has a density equal to the bulk density value of the high-k dielectric material minus 10%, and most preferably the second selected thickness $t_2$ may be between ⅕ and ¼ of the thickness at which the high-k dielectric layer has a density equal to the bulk density value of the high-k dielectric material or between ⅕ and ¼ of the thickness at which the high-k dielectric layer has a density equal to the bulk density value of the high-k dielectric material minus 10%. Preferably the high-k dielectric layer 1 is thinned using an etching process, more preferably a wet etching process. The wet etchant mixture may comprise HF.

Figure 12:
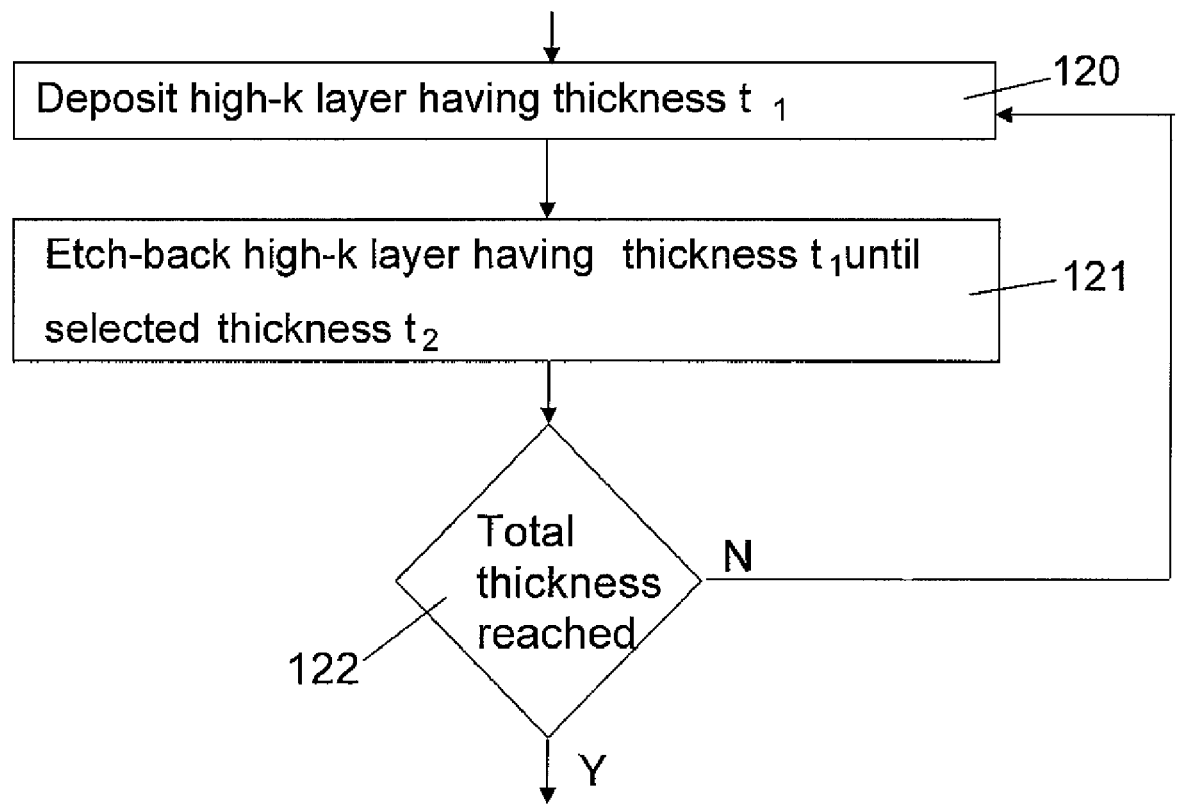
FIG. 12 shows a flow chart illustrating the sequence of a method for manufacturing a thin high-k dielectric layer according to an embodiment of the present invention.

FIG. 12 shows a flow chart illustrating the sequence of a method for manufacturing a thin high-k dielectric layer according to another embodiment of the invention. On a substrate 3, preferably a semiconductor substrate such as silicon, silicon-on-insulator, germanium, germanium-on-insulator, a III-V substrate such as a GaAs, Inp, GaAlAs substrate a layer 1 of a high-k dielectric material is deposited as illustrated in process 120. This high-k dielectric layer can be selected from the group comprising metal oxides such as but not limited titanium oxide, tantalum oxide, aluminium oxide, zirconium oxide, lanthanum oxide, hafnium oxide, hafnium aluminum oxide and hafnium scandium oxide; metal silicates such as but not limited to hafnium silicate and zirconium silicate; metal oxynitrides such as but not limited to titanium oxynitride, tantalum oxynitride, aluminium oxynitride, zirconium oxynitride, lanthanum oxynitride, hafnium oxynitride and hafnium scandium oxynitride; metal silicon oxynitrides such as but not limited to hafnium silicon oxynitride and zirconium silicon oxynitride; or any combination thereof. This high-k dielectric can be formed using ALD or MOCVD or any technique known to a person skilled in the art. This high-k dielectric layer 1 has a first selected thickness $t_1$. The first selected thickness $t_1$ is such that the high-k dielectric layer has a density equal to at least the bulk density value of the high-k dielectric material minus 10%. The first selected thickness $t_1$ is dependent on the high-k material used. This high-k dielectric layer 1 is then thinned as illustrated in process 111 to a layer having second selected thickness $t_2$. The second thickness $t_2$ may at least be ⅕ of the thickness at which the high-k dielectric layer has a density equal to the bulk density value of the high-k dielectric material minus 10%.

Preferably, the second selected thickness $t_2$ may be between ⅕ and ½ of the thickness at which the high-k dielectric layer has a density equal to the bulk density value of the high-k dielectric material or between ⅕ and ½ of the thickness at which the high-k dielectric layer has a density equal to the bulk density value of the high-k dielectric material minus 10%, more preferably the second selected thickness $t_2$ may be between ⅕ and ⅓ of the thickness at which the high-k dielectric layer has a density equal to the bulk density value of the high-k dielectric material or between ⅕ and ⅓ of the thickness at which the high-k dielectric layer has a density equal to the bulk density value of the high-k dielectric material minus 10%, and most preferably the second selected thickness $t_2$ may be between ⅕ and ¼ of the thickness at which the high-k dielectric layer has a density equal to the bulk density value of the high-k dielectric material or between ⅕ and ¼ of the thickness at which the high-k dielectric layer has a density equal to the bulk density value of the high-k dielectric material minus 10%. Preferably the high-k dielectric layer 1 is thinned using an etching process, more preferably a wet etching process. The wet etchant mixture may comprise HF. The sequence of depositing a high-k dielectric layer 1 with a selected first thickness $t_1$, reducing the thickness to a selected second thickness $t_2$, preferably using a wet etching process, can be repeated until a high-k dielectric layer of the desired total thickness is obtained. This high-k dielectric then comprises a sequence of deposited and etched-back layers of high-k dielectric material. The thickness as-deposited and after depositing being selected to yield a layer of high-k material with the selected homogeneity and improved device performance.

It is to be understood that although preferred embodiments, specific constructions and configurations, as well as materials, have been discussed herein for devices according to the present invention, various changes or modifications in form and detail may be made without departing from the scope and spirit of this invention.

The foregoing embodiments may be utilized to form high-quality high-k dielectric layers, preferably thin, i.e. in the nanometer range, which can be used as gate dielectric layer in semiconductor devices, e.g., in field effect transistors.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of fabricating a high-k dielectric layer comprising:
    depositing onto a substrate a high-k dielectric material so as to form a high-k dielectric layer with a first thickness, the first thickness is selected so that the high-k dielectric layer has a density of at least the bulk density value of the high-k dielectric material minus about 10%; and
    thinning the high-k dielectric layer to a second thickness, the second thickness being selected so that the high-k dielectric layer having been thinned to the second thickness has a higher density than is obtained by depositing the high-k dielectric material with the second thickness.

2. The method according to claim 1, wherein the second thickness is at least ⅕ of the thickness at which a high-k dielectric layer deposited has a density equal to the bulk density value of the high-k dielectric material minus 10%.

3. The method according to claim 2, wherein the second thickness is less than about ½ of the thickness at which a high-k dielectric layer deposited has a density equal to the bulk density value of the high-k dielectric material minus 10%.

4. The method according to claim 2, wherein the second thickness is less than about ⅓ of the thickness at which a high-k dielectric layer deposited has a density equal to the bulk density value of the high-k dielectric material minus 10%.

5. The method according to claim 2, wherein the second thickness is less than about ¼ of the thickness at which a high-k dielectric layer deposited has a density equal to the bulk density value of the high-k dielectric material minus 10%.

6. The method according to claim 1, wherein the thinning of the high-k dielectric layer to a second thickness is performed by etching back the high-k dielectric layer.

7. The method according to claim 6, wherein the etching back of the high-k dielectric layer is performed by a wet etching process.

8. The method according to claim 1, wherein the second thickness is selected such that the high-K dielectric layer of the second thickness has a desired layer quality.

9. The method according to claim 8, wherein the layer quality is defined by at least one of the following parameters: density, film closure, roughness, and electrical leakage.

10. The method according to claim 1, wherein the high-k dielectric layer is at least one of the following: a metal oxide, metal silicate, metal oxynitride, and metal silicon oxynitride.

11. The method according to claim 1, wherein the process of depositing the high-k dielectric layer with a first thickness and thinning the high-k dielectric layer to a second thickness are repeated sequentially.

12. The method according to claim 1, wherein the high-k dielectric layer has a k value higher than 3.9.

13. The method according to claim 1, wherein the high-k dielectric layer functions as gate dielectric in a field effect transistor.

14. The method according to claim 1, wherein the first and second thickness are selected such that the high-k dielectric layer formed after the thinning process has a higher density than a density of a high-k dielectric layer formed by depositing the high-k dielectric material with the second thickness.

15. A method of fabricating a high-k dielectric layer comprising:
    depositing, by a metal organic chemical vapor deposition (MOCVD) process, a high-k dielectric layer of a first thickness, the first thickness is selected so that the high-k dielectric layer deposited has a density of at least the bulk density value of the high-k dielectric material minus about 10%; and
    thinning the high-k dielectric layer to a second thickness, wherein the second thickness is selected so that the high-k dielectric layer having been thinned to the second thickness has a higher density than is obtained by depositing the high-k dielectric material with the second thickness.

* * * * *